United States Patent [19]

Brinegar

[11] 4,129,825
[45] Dec. 12, 1978

[54] ELECTRICAL CONDUCTOR AND SHORT CIRCUIT LOCATOR

[76] Inventor: Paul E. Brinegar, 1731 Springlake Dr., Fort Worth, Tex. 76012

[21] Appl. No.: 792,923

[22] Filed: May 2, 1977

Related U.S. Application Data

[63] Continuation-in-part of Ser. No. 551,816, Feb. 21, 1975, Pat. No. 4,021,730.

[51] Int. Cl.² .................... G01R 31/08; G01R 31/02
[52] U.S. Cl. ......................................... 324/52; 324/66
[58] Field of Search ..................... 324/51, 52, 66, 67

[56] References Cited

U.S. PATENT DOCUMENTS

| | | | |
|---|---|---|---|
| 2,127,216 | 8/1938 | Hallden et al. | 324/52 |
| 2,176,755 | 10/1939 | Borden | 324/52 |
| 2,176,757 | 10/1939 | Borden | 324/52 |
| 2,641,633 | 6/1953 | Hosford | 324/52 |
| 3,621,384 | 11/1971 | Yamada | 324/52 |
| 3,699,433 | 10/1972 | Smith | 324/52 |
| 3,829,765 | 8/1974 | Siler | 324/67 |
| 3,991,363 | 11/1976 | Lathrop | 324/52 |

Primary Examiner—Gerard R. Strecker
Attorney, Agent, or Firm—Wofford, Felsman, Fails & Zobal

[57] ABSTRACT

An apparatus for locating electrical conductors and short circuits in AC and DC circuits is disclosed herein. The apparatus has leads for connecting across open circuit breaker or fuse box terminals. Current limiting resistors and transistors limit the current, if AC or converted to pulsated DC, to a value that is sufficiently high to be read on a clamp-on ammeter at any point in the circuit being tested. A first pulse generator intermittently interrupts the current through the current limiting means to create a momentary pulse of approximately ½ to 1 second duration at a frequency of approximately 3 to 5 seconds. A second pulse generator interrupts the current limiting means at approximately 225 cycles per second to provide a pulsating component in the momentary pulse for DC circuits. A clamp-on ammeter will indicate this pulse at all points in the circuit except at the short circuit, whether in a DC or AC circuit.

8 Claims, 2 Drawing Figures

ELECTRICAL CONDUCTOR AND SHORT CIRCUIT LOCATOR

CROSS-REFERENCE TO RELATED APPLICATIONS

This application is a continuation-in-part of my copending application Ser. No. 551,816, filed Feb. 21, 1975, U.S. Pat. No. 4,021,730.

BACKGROUND OF THE INVENTION

1. Field of the Invention

This invention relates to an apparatus for locating conductors and short circuits in AC and DC circuits.

2. Description of the Prior Art

AC and DC circuits are often wired in bundles containing conductors for other circuits. Some of the conductors may be in DC circuits and others in AC circuits. Should it be desired to trace a conductor or to locate a short circuit, various devices have been devised to locate a particular conductor within the bundle.

One such device, shown in U.S. Pat. No. 3,623,142 uses cam operated switches driven by an electrical motor to provide a pulsating current that is detected by a clamp-on ammeter. Another device, shown in U.S. Pat. No. 3,621,384 is for use only with DC circuits. A current transducer converts the direct current into periodical current. A complex searching head induces pulses in response to the periodical current and changes the output to sound or visible signals.

SUMMARY OF THE INVENTION

It is a general object of this invention to provide an improved apparatus for locating short circuits and tracing electrical conductors.

It is a further object of this invention to provide an improved apparatus for locating short circuits and tracing electrical conductors that utilizes a conventional clamp-on ammeter as the searching head and does not require mechanical switching elements.

It is a further object of this invention to provide an improved apparatus for locating short circuits and tracing electrical conductors either in AC circuits, DC circuits, or DC circuits in a common bundle with AC circuits, without requiring any knowledge by the operator of the particular type of circuit being tested.

In accordance with these objects an apparatus is provided that is placed across the terminal of the circuit breaker or fuse terminals to pulsate the current in the circuit being tested. A first pulse generator provides a momentary pulse of ½ to 1 second duration every 3 to 5 seconds. This pulse controls a switching and current limiting circuit that allows the current in the circuit being tested to flow whenever the pulse is generated. The current is limited, but remains at a fairly high value, 0.25 to 5 amps. If the circuit is AC, a conventional clamp-on ammeter placed around the wires in the circuit will display the momentary pulse, enabling the conductor to be traced. The momentary pulses will not be visible at and past the short circuit. A second pulse generator or chopper is connected in series with the first pulse generator. It operates at a much higher frequency, 100 to 500 Hz (cycles per second), to pulsate the momentary pulse. Since a clamp-on ammeter will indicate only alternating or pulsating currents, this gives the momentary pulse a pulsating component for indication in DC circuits. The first pulse generator can be eliminated for DC circuits that have no AC circuits in a common bundle. A clamp-on ammeter, which is not effected by DC in other wires, would read only the steady state pulsating current created by the chopper.

DESCRIPTION OF THE PREFERRED EMBODIMENT

Figure 1:
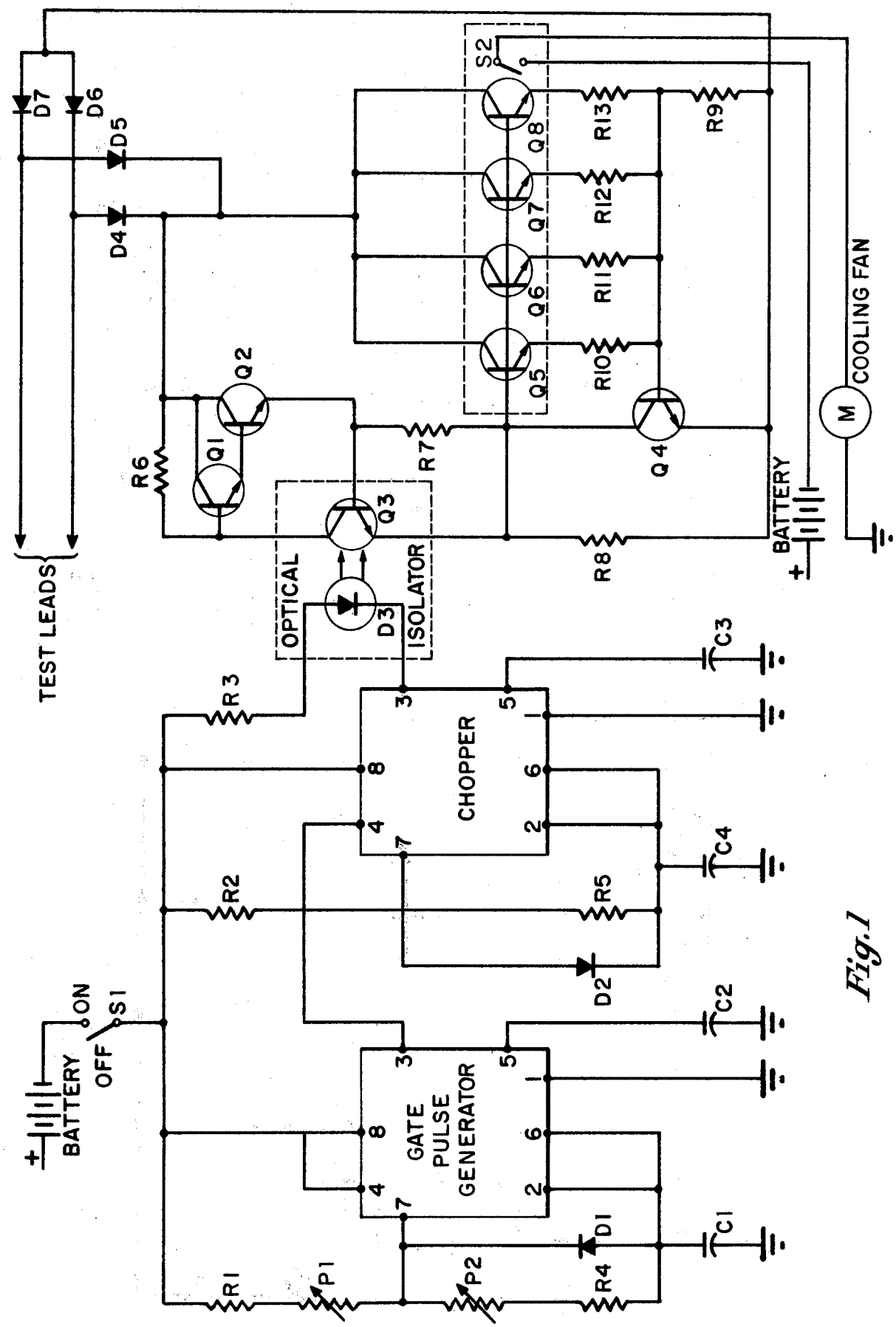
FIG. 1 is a schematic diagram of the testing apparatus according to the preferred embodiment of the invention.

FIG. 1 shows the schematic diagram for an apparatus that will trace conductors in AC circuits, DC circuits, and in DC circuits that are located in a common bundle with AC circuit conductors. The first pulse generating means or the gate pulse generator is a conventional NE555 integrated circuit timer. Pins 4 and 8 of the gate pulse generator are connected to switch S1, which in turn is connected to power supply means, preferably a 12 volt battery. Pin 7 is connected to switch S1 through potentiometer P1 and resistor R1. Pins 2 and 6 are connected to switch S1 through resistor R4 and potentiometer P2. A diode D1 is shunted across resistor R4 and potentiometer P2, with its cathode connected to pins 2 and 6. Pins 2 and 6 are separated from ground by capacitor C1. Pin 1 is grounded and pin 5 is separated from ground by capacitor C2. Capacitors C1 and C2, resistors R1 and R4, potentiometers P1 and P2 and diode D1 provides biasing for the gate pulse generator. Potentiometers P1 and P2 can be adjusted to vary the pulse duration between ½ to 1 second occuring every 0 to 5 seconds. Preferably the pulse is of 3/4 second duration at a frequency of 3 seconds.

Pin 3 of the gate pulse generator is connected to pin 4 of a second pulse generator or chopper, and is used to gate the chopper on and off. The chopper is also a NE555 integrated circuit timer, however it is biased to deliver negetive going pulses at 100 to 500 cycles per second, preferably 225 cycles per second, with a 20–30% duty cycle. During each cycle, the pulse generated will be "on" for only 20 to 30%, preferably 25% of the cycle. Pin 8 of the chopper is connected to switch S1. Pin 7 is connected through resistor R2 to switch S1. Pins 2 and 6 are connected to resistor R5, which is in series with resistor R2. A diode D2 is shunted across resistor R5, with its cathode connected to pins 2 and 6. Pins 2 and 6 are separated from ground by capacitor C4. Pin 1 is grounded and pin 5 is separated from ground by capacitor C3.

The output of the chopper at pin 3 is connected to an optical isolator. The optical isolator is a conventional 4N25 isolator, and comprises essentially a light emitting diode D3 positioned adjacent a photosensitive transistor Q3. LED D3 emits light when it is conducting, as indicated by the arrows. This light essentially raises the bias on the base of transistor Q3, causing it to conduct, energyzing the switch and current limiting means. The optical isolator provides a barrier of 2500 volts between the pulse generating circuits and the switch and current limiting circuits. LED D3 has its cathode connected to pin 3 of the chopper and its anode connected through resistor R3 to switch S1.

Transistor Q3 is a NPN transistor connected to switch means for turning on and off the flow of current through the test leads. The switch means includes NPN transistors Q1 and Q2, which are connected to the test leads through diode D4 through D7. Diodes D4 through D7 provide a full wave bridge circuit, allowing the polarities to be reversed for DC circuits. The first test lead is connected through diode D4 and resistor R6 to the collector of transistor Q3 and base of transistor Q1. Diode D4 has its cathode connected to resistor R6 for current flow should this lead be connected to a positive potential in the circuit. This test lead is connected through diode D6 and resistor R8 to the emitter of transistor Q3. Diode D6 has its anode connected to resistor R8 for current flow should this lead be connected to a negative potential in the circuit being tested. Diodes D5 and D7 are connected with the other test lead and resistors R6 and R8 in the same manner.

Transistor Q1 has its collector connected between resistor R6 and the test leads, and its emitter connected to the base of transistor Q2. The collector of transistor Q2 is connected between resistor R6 and the test leads. The emitter of transistor Q2 is connected through resistors R7 and R8 to the test leads. Consequently the energizing of photosensitive transistor Q3 causes transistor Q1 to conduct, which in turn switches on transistor Q2.

The emitter of transistor Q2 is connected through resistor R7 to the bases of four NPN pass transistors Q5 through Q8. The bases are also connected between the emitter of transistor Q3 and resistor R8. These transistors along with transistor Q4 and resistors R9 through R13, maintain a constant current through the test leads. Each pass transistor Q5 through Q8 has its collector connected to the test leads through diodes D4 and D5, and its emitter connected through current limiting resistors R9 through R13 and diodes D6 and D7 to the test leads.

Current limiting resistors R10 through R13 force current to flow equally through transistors Q5 through Q8. Transistors Q5 through Q8 are mounted on a heat sink fitted with a fan M actuable by thermostatic switch S2 at a selected maximum temperature. Transistor Q4 has its base coupled between resistor R9 and resistors R10 through R13. Its collector is connected to the base of transistors Q5 through Q8, and its emitter is connected to the test leads through diodes D6 and D7. Resistor R8 ensures that the current through the pass transistors Q5 through Q8 remains switched positively off during the off period.

In operation, the test leads are placed across the circuit breaker or fuse terminals. The breaker should be open or the fuse removed or blown so that current in the circuit to be tested flows through the apparatus. Switch S1 is closed to provide a power source to the pulse generator and chopper to create pulses. The chopper is gated by the gate pulse generator to produce a momentary pulse of preferably ¾-second duration every 3 seconds. This momentary pulse is pulsated at the rate of 225 Hz by the chopper. This activates LED D3 and photosensitive transistor Q3 of the optical isolator at the same rate. The optical isolator switches on and off the transistors Q1 and Q2, which control the bias source to the pass transistors Q5 through Q8. This allows current to intermittently flow through the pass transistors and current limiting resistors R9 through R13. The current limiting resistors and pass transistors limit the current to 0.25 to 5 amps, preferably approximately 1.5 amps. The minimum of 0.25 amps is governed by the response of a conventional clamp-on ammeter. A lower minimum may be used with more responsive ammeters such as a digital clamp-on ammeter, so long as the pulses can be indicated with certainty. The upper limit is governed by the components needed to dissipate the heat generated.

The operator proceeds down the bundle of wires with a conventional clamp-on ammeter surrounding the entire bundle, observing the momentary pulses. At and past the short circuit, the momentary pulses will no longer be observed since current will not be flowing through this portion of the circuit. The operator then clamps the clamp-on ammeter around single conductors at the short circuit point until the particular conductor that is shorted is located. A similar procedure may be used in tracing a conductor within a common bundle.

The above procedure is followed regardless of whether the circuit is AC, DC, or DC in a common bundle with AC circuits. If the circuit is AC, a steady current reading will be detected along with the momentary pulses. The chopper is unnecessary for AC circuits since the AC in the circuit will be sufficient for the ammeter to detect the momentary pulse. However, the chopper does not detract from the operation of the apparatus and detection of the pulses in AC circuits.

If the circuit is DC, but the DC circuit is located within conductors having AC components, then the ammeter will indicate a current reflecting the AC in these other conductors. The chopper provides the necessary pulsating component for the momentary pulse to be detected in the DC circuit. Consequently the pulse will be superimposed or added to the essentially steady state reading observed from the adjacent AC conductors. In order to differentiate this circuit from AC circuits, both the chopper and the gate pulse generator are necessary.

If all of the conductors in a bundle are in DC circuits, then the gate pulse generator is unnecessary. DC currents flowing through adjacent conductors will not affect the clamp-on ammeter. The 225 Hz pulsating current supplied by the chopper will be indicated as a steady current on the clamp-on ammeter. Consequently without the gate pulse generator, the operator would observe a steady current on the clamp-on ammeter until or past the short circuit, at which time the reading would drop to zero. However the momentary pulses supplied by the gate pulse generator do not detract from the testing in this type of circuit.

Figure 2:
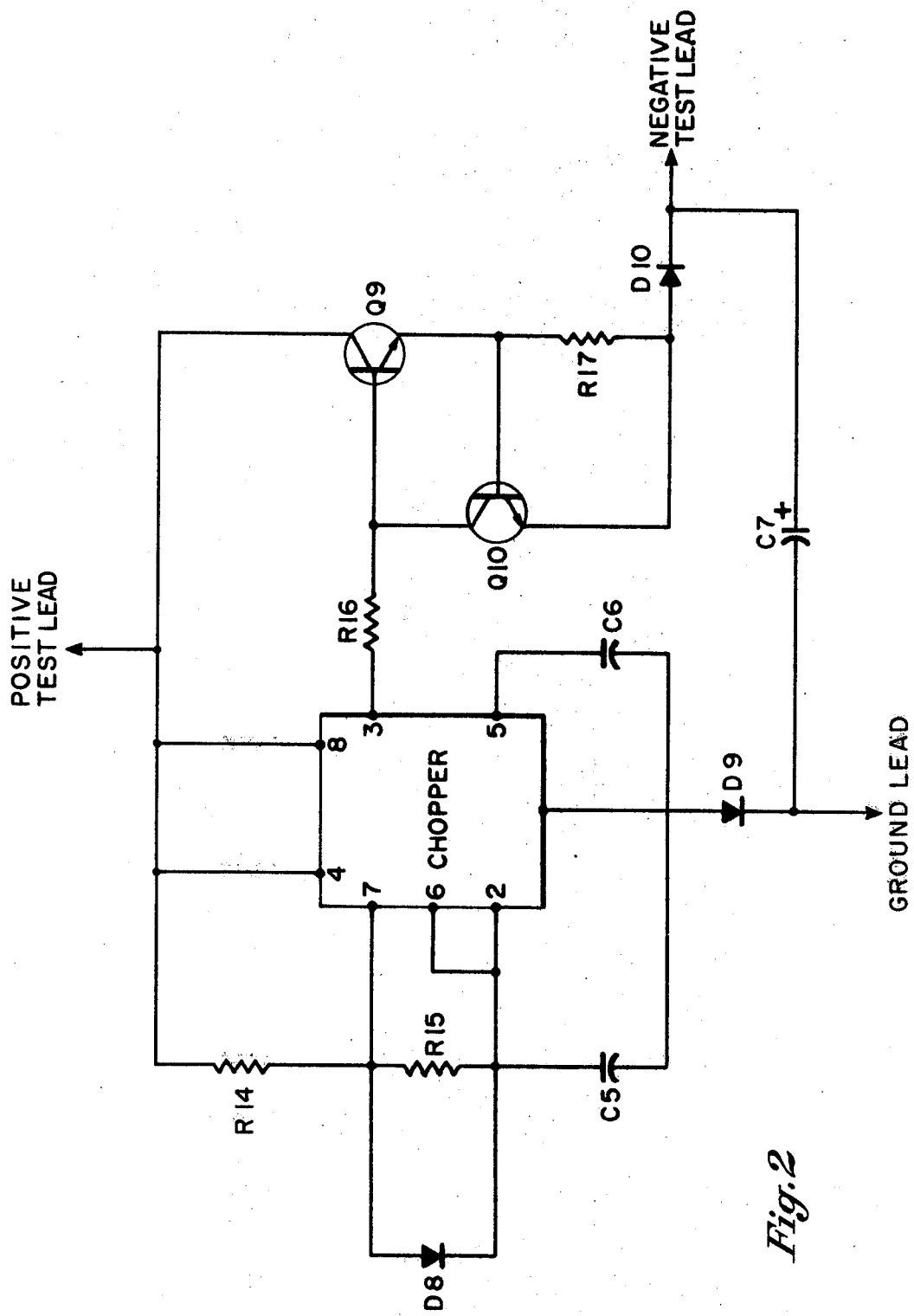
FIG. 2 is a schematic diagram of a testing apparatus for use only with DC circuits according to the principles of this invention.

The embodiment in FIG. 2 is a less complex apparatus for detecting shorts in DC circuits wherein no AC circuit conductors are located in the same bundle. The chopper is a NE555 integrated circuit timer biased to pulsate at a rate between 100 and 500 Hz, preferably 300 Hz. The duty cycle is in the range from 20 to 30 percent, preferably 23 percent "on" duration. Pins 4 and 8 are connected to the test lead that whould be coupled to the positive side of the fuse terminal. Pin 7 is connected through resistor R14 to the positive test lead. Pins 6 and 2 are connected through resistors R15 and R14 to the positive test lead. A diode D8 is shunted across resistor R15. Pins 2 and 6 are separated by capacitor C5 from diode D9, which is connected to a test lead that should be grounded. Pin 1 is connected also to the anode of D9. Pin 5 is separated from diode D9 by capacitor C6. The output at pin 3 is connected to the base of transistor Q9 through resistor R16.

The collector of transistor Q9 is connected to the positive lead. The emitter of transistor Q9 is connected through current limiting resistors R17 and diode D10 to the negative lead. The emitter is also connected to the base of transistor Q10. The collector of transistor Q10 is connected to the base of transistor Q9, and the emitter is connected to the negative test lead through diode D10. A capacitor C7 separates the negative lead from the ground lead.

Diodes D2 and D3 prevent damage to the unit if the test leads are attached in reverse to the polarity of the circuit being tested. Capacitor C3 prevents load transients from affecting operation of the testing device. Capacitor C5 and C6, diode D8, and resistors R14 and R15 bias the chopper to establish the frequency, duty cycle and fall time of the oscillator. Transistor Q9 is the main power or pass transistor and resistor R17 limits the amount of current through transistor Q9 to a value in the range between 0.25 and 5 amps, preferably 1.5 amps. Transistor Q10 regulates transistor Q9 to prevent changes in the load requirement from affecting the action of transistor Q9 as a constant current source or generator.

In operation, the positive test lead is connected to the positive side of the terminal, the negative test lead is connected to the negative side, and the ground lead is connected to the ground. The potential from the circuit being tested provides a power source for the chopper, which produces pulses at 300 Hz, with 23 percent duty. This pulse controls transistor Q9 to cause current to flow through transistor Q9 and resistor R17 at the same frequency. A steady AC current will be indicated in the circuit being tested by a clamp-on ammeter at all points except at and past the short circuit, when the indication will drop from approximately 1.5 amps to zero.

It should be apparent that an invention having significant improvements has been provided. The testing apparatus allows short circuits and conductors to be traced by using a conventional clamp-on ammeter as the searching head. Mechanical switching elements are not required. The preferred embodiment may be used with either AC, DC, or DC circuits in common bundles with AC conductor circuits, without requiring any switching by the operator.

While the invention has been shown in only two of its forms, it should be apparent to those skilled in the art that it is not so limited but is susceptible to various changes and modifications without departing from the spirit thereof.

I claim:

1. An apparatus for locating electrical conductors and short circuits comprising:
   first and second test leads for connecting across open circuit breaker means in a circuit to be tested; the open circuit breaker means having a voltage potential across its terminals due to a circuit power source;
   current limiting means connected across the test leads for allowing current due to the circuit power source to flow through the current limiting means and the circuit, and for limiting the current in the circuit being tested to a predetermined value to prevent excessive short circuit current in the circuit being tested; the predetermined value being sufficiently high such that pulsated and alternated currents are discernable at conducting points in the circuit by a clamp-on ammeter;
   first pulse generating means, cooperating with the current limiting means, for intermittently interrupting the current in the circuit being tested; the first pulse generating means providing an on duration of the current in the circuit being tested sufficient for a clamp-on ammeter in an AC circuit to indicate a momentary pulse with the off duration substantially greater than the on duration; and
   second pulse generating means, cooperating with the current limiting means and connected in series with the first pulse generating means, for interrupting the momentary pulse created by the first pulse generating means to provide a pulsating component in the momentary pulse so that a current reading is visible on a clamp-on ammeter in a DC circuit at all points along the circuit except at the short circuit.

2. The apparatus according to claim 1 wherein the first pulse generating means provides a pulse of duration substantially in the range from ½ to 1 second occurring at a frequency substantially in the range from 3 to 5 seconds.

3. The apparatus according to claim 2 wherein the current limiting means limits the current to an amplitude substantially in the range from 0.25 amps to 5 amps.

4. The apparatus according to claim 3 wherein the second pulse generating means provides pulses of frequency substantially in the range from 100 to 500 cycles per second.

5. The apparatus according to claim 4 wherein the pulses generated by the second pulse generating means have a duty cycle of approximately 20 to 30 percent on-duration.

6. An apparatus for locating electrical conductors and short circuits, comprising:
   power supply means for providing a DC voltage;
   first pulse generating means connected to the power supply means for generating a momentary pulse of substantially ½ to 1 second duration substantially every 3 to 5 seconds;
   second pulse generating means connected in series with the first pulse generating means for pulsating the momentary pulse at a frequency in the range from 100 to 500 cycles per second;
   first and second test leads for connecting across open circuit breaker means in a circuit to be tested; the open circuit breaker means having a voltage potential across its terminals due to a circuit power source;
   current limiting means connected across the test leads for allowing current in the circuit due to the circuit power source to flow through the current limiting means and the circuit, and for limiting the current in the circuit being tested to a pulsating and alternating value substantially in the range from 0.25 to 5.0 amps;
   switch means connected with the current limiting means for switching on and off the current flow; and
   optical isolator means, including a light emitting diode and a photosensitive transistor, for actuating the switch means responsive to the pulsating output from the second pulse generator means, thereby causing an intermittent current pulse in the circuit being tested for detection by a clamp-on ammeter.

7. The apparatus according to claim 6 wherein the pulses generated by the second pulse generator have a duty cycle of 2 to 30 percent on duration to reduce the amount of time in which current is flowing through the circuit being tested.

8. An apparatus for locating electrical conductors and short circuits, comprising:

power supply means for providing a DC voltage;

first pulse generating means connected to the power supply means for generating a momentary pulse with an on duration sufficient for a clamp-on ammeter in an AC circuit to indicate a momentary pulse, with the off duration considerably greater than the on duration;

second pulse generating means connected in series with the first pulse generating means for pulsating the momentary pulse at a frequency sufficiently high so that a current reading is visible on a clamp-on ammeter in a DC circuit;

first and second test leads for connecting across open circuit breaker means in a circuit to be tested; the open circuit breaker means having a voltage potential across its terminals due to a circuit power source;

current limiting means connected across the test leads for allowing current in the circuit due to the circuit power source to flow through the current limiting means and the circuit, and for limiting the current in the circuit being tested to a predetermined value to prevent excessive short circuit current; the predetermined value being sufficiently high such that pulsated and alternated currents are discernable at conducting points in the circuit by a clamp-on ammeter;

switch means connected with the current limiting means for switching on and off the current flow; and optical isolator means, including a light emitting diode and a photosensitive transistor, for actuating the switch means responsive to the pulsating output from the second pulse generator means, thereby causing an intermittent current pulse in the circuit being tested for detection by a clamp-on ammeter.

* * * * *